(12) United States Patent
Nistler et al.

(10) Patent No.: US 7,068,035 B2
(45) Date of Patent: Jun. 27, 2006

(54) MAGNETIC RESONANCE APPARATUS WITH A DETUNABLE RF RESONATOR

(75) Inventors: Jürgen Nistler, Erlangen (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/986,606

(22) Filed: Nov. 12, 2004

(65) Prior Publication Data

US 2005/0162165 A1    Jul. 28, 2005

(30) Foreign Application Priority Data

Nov. 14, 2003   (DE) .................................. 103 53 343

(51) Int. Cl.
*G01V 3/00*   (2006.01)

(52) U.S. Cl. ...................................... 324/322; 324/318

(58) Field of Classification Search ................ 324/322, 324/318
See application file for complete search history.

(56) References Cited

U.S. PATENT DOCUMENTS

| 4,763,076 A * | 8/1988 | Arakawa et al. ............. 324/322 |
| 6,232,779 B1 * | 5/2001 | Tropp et al. ................. 324/322 |
| 6,925,322 B1 * | 8/2005 | Helfer et al. ................ 600/423 |
| 6,943,551 B1 * | 9/2005 | Eberler et al. ............... 324/318 |

FOREIGN PATENT DOCUMENTS

| DE | OS 44 14 371 | 7/1995 |
| DE | PS 44 22 069 | 9/1995 |
| DE | OS 102 28 827 | 1/2004 |

* cited by examiner

*Primary Examiner*—Diego Gutierrez
*Assistant Examiner*—Jeremiah Shipman
(74) *Attorney, Agent, or Firm*—Schiff Hardin LLP

(57) ABSTRACT

A magnetic resonance apparatus with a radio-frequency shield at a reference potential, a detuning circuit and an electrical line which is connected with the detuning circuit. The electrical line is fashioned as a strip conductor and is attached to the radio-frequency shield. The strip conductor can be used for direct current/direct voltage supply of the detuning circuit. This has the advantage that the detuning circuit can be activated without exerting a significant interfering influence on the magnetic field in the magnetic resonance apparatus.

8 Claims, 2 Drawing Sheets

MAGNETIC RESONANCE APPARATUS WITH A DETUNABLE RF RESONATOR

BACKGROUND OF THE INVENTION

1. Field of the Invention

The present invention concerns a magnetic resonance apparatus of the type having a radio-frequency shield at a reference potential, a detuning circuit and an electrical conductor connected to the detuning circuit.

2. Description of the Prior Art

Modern magnetic resonance (MR) apparatuses normally operate with a number of different antennas (also called coils in the following) to radiate radio-frequency pulses (RF pulses) for exciting nuclear magnetic resonance and/or for receiving the induced magnetic resonance signals. An MR apparatus typically has a larger, whole-body coil, also called a body coil (BC), normally integrated in a fixed manner in the apparatus, as well as a number of small local coils (LC), also called surface coils. In contrast to the whole-body coil, the local coils serve for obtaining a detailed image of body parts or organs of a patient that are located relatively near to the body surface. For this purpose, the local coils are applied directly to the location of the patient at which the region to be examined is located. Given the use of such a local coil, in many cases the exciting signal (energy) is emitted by the whole-body coil (as a transmitter coil) fixedly integrated into the MR apparatus and the induced MR signals are received with the local coil (as a receiver coil). So that the coils do not interact with one another, it is necessary to detune the receiver coil in the transmission phase and the transmitter coil in the reception phase. Upon detuning, the eigenresonance (self-resonance) frequency of the respective antenna is shifted such that it no longer lies in the range of the operating MR frequency. An antenna shifted in this manner behaves neutrally in the ideal case, i.e. it is transparent to the RF pulses emitted by the other coils, or the induced MR signals. Insofar as there is a constant switching back and forth between two different antennas, this temporary shifting in the transmission phase and the reception phase is called a "dynamic detuning". A coil also can be permanently detuned, insofar as it should only be operated with another coil. Such a "static detuning" is in particular necessary when a transmission-capable local coil is used that assumes both the transmission and the reception functions. Since the larger whole-body coil integrated into the MR apparatus cannot be physically removed during the imaging data acquisition, it is electrically deactivated by the detuning.

A number of magnetic resonance antennas that exhibit a structure known as a birdcage structure are known for use as a whole-body coil. Such an antenna has a number of longitudinal antenna rods running in parallel and arranged on a cylindrical surface, the longitudinal antenna rods being respectively connected to one another at the ends in a radio-frequency manner via an antenna ferrule. The longitudinal antenna rods and antenna ferrules in principle can be fashioned in an arbitrary form. In many cases, they are conductor strips that are applied on a flexible conductor strip or foil that is cylindrically wound around the measurement space in which the examination subject is located during the examination. In a whole-body coil, the birdcage structure runs around the patient acceptance chamber in which the patient is positioned during the exposure. In local coils in the form of a birdcage structure, the measurement space serves for the acceptance of the head or other extremities of a patient in order to precisely examine that region.

In principle there are various possibilities to detune such MR antennas with a birdcage structure.

Insofar as the field strength of the base magnetic field (also called the B0 field in the following) of the magnetic resonance system is below two Tesla, a detuning is very easily possible via the radio-frequency feed line. A short-circuit is thereby benerated at the coil-distal end of the feed line to detune the antenna by means of a suitable switching element, for example a PIN diode or a relay. This short is transferred via the feed line to the feed point, i.e. the connection point at which the feed line is connected to the antenna. The detuning thereby achieved is sufficient to suppress coupling with the other active antenna. The advantage of such a coildistal detuning is that the supply line for the direct current that is necessary for the switching elements can be easily realized since, due to the large separation, no interaction of the switching direct current with the high static and radio-frequency fields occurs in the immediate surroundings of the antenna.

At higher B0 field strengths, however, the coil-distal detuning is not reliable. In such cases it is necessary to integrate the detuning elements directly into the structure of the antenna. In the detuning of an antenna with a birdcage structure, this can occur either by the antenna ferrules or the longitudinal antenna rods, or both, being detuned. Given such a detuning, a resonant inductor generally is interrupted or a resonant capacitor is bridged, i,e. shorted, by means of a suitable radio-frequency switching element. Switching diodes, for example PIN diodes, are currently used as RF switching elements since these are able to withstand both high currents and high voltages at high frequency and additionally can be switched sufficient rapidly.

Ferrule detuning in a birdcage structure is advantageous because easy access to the detuning elements, i.e. the RF switching elements, is possible from the outside, so the necessary direct current supply lines can be suitably placed without problems. In terms of radiofrequency, such a ferrule detuning in a birdcage structure, however, is not the optimal solution. Antennas with birdcage structures therefore are known in which the radio-frequency switching elements are arranged within the longitudinal rods, i.e. longitudinal inductors, with which radio-frequency switching elements in the appertaining longitudinal rods can be interrupted and thus the entire rod structure can be detuned. Each RF switching element is individually fed with the necessary direct current signals from outside, i.e. from outside of the birdcage structure. A significant disadvantage is that these supply lines must be placed through the resonant structure Without the antenna being disturbed with regard to its radio-frequency function. Each individual direct current supply line must therefore be individually choked and decoupled, for which special, very complicated condutors are used. Aside from the fact that the spatial relationships inside the iresonant structure are crowded and only components that are difficult to access can be accepted for the coupling and decoupling, this design is very costly due to its high production expenditure.

A circuit arrangement to control a radio-frequency switching diode is known from German PS 44 22 069, in which one diode is arranged electrically antiparallel (with opposite polarity) to the radio-frequency switching diode. A control signal to activate the radio-frequency switching diode can be generated from a radio-frequency current to be switched by the radio-frequency switching diode. A capacitive element is electrically connected in series with the diode. The capacitive element is bridged with a switch that can be electrically controlled by a control input. A control unit is connected with the control input. The control unit outputs an activation signal to the controllable switch. The diode can generate the control signal to activate the radio-frequency switching diode.

From German OS 44 14 371, a magnetic resonance apparatus is known in which a radio-frequency shield is arranged between a radio-frequency antenna and a gradient coil system of the magnetic resonance apparatus. The radio-frequency shield is fashioned such that it is permeable to the electromagnetic fields generated by the gradient coil system and impermeable to the fields in the radio-frequency range generated by the radio-frequency antenna. The radiofrequency shield has a first electrically-conductive layer arrangement and a second electrically-conductive layer arrangement opposite the first, the layer arrangements being separated from one another by a dielectric. The layer arrangement have conductor paths arranged next to one another that are separated from one another by electrically-insulating slits. The slits in the first layer arrangement are offset relative to those in the second, and in at least one layer arrangement adjacent conductor paths are connected with one another by specially arranged bridges (for example formed by capacitors) conducting radio-frequency current.

A radio-frequency structure with a force generator is known from German OS 102 28 827. The force generator can adjust a predetermined shape of the radio-frequency structure. For this purpose, actuators that are fashioned as copper conductor runs are activated by an electrode structure and are simultaneously used as antenna conductors to transmit radio-frequency signals and to receive magnetic resonance signals.

SUMMARY OF THE INVENTION

An object of the present invention is to provide a magnetic resonance apparatus with an electrical unit, for example a detuning circuit of the magnetic resonance apparatus, which is electrically supplied in a simple manner without exerting: a large interfering influence on the magnetic field in the magnetic resonance apparatus.

This object is achieved by a magnetic resonance apparatus of the type initially described wherein electrical conductor is fashioned as a strip conductor and is applied on a radio-frequency shield. This has the advantage that no further measures are necessary in order to suppress the coupling of RF interferences on the direct current supply, or in order to reduce interferences of the direct current supply on the magnetic field. The strip conductor can be used, for example, for direct current feed of a detuning circuit of the MR apparatus. Since it lies very close to the radio-frequency shield, which generally is connected to ground, only very few magnetic field lines can penetrate between the shield and the conductor, such that barely any interferences can be induced.

The strip conductor typically has an insulation cladding that lies between a line of the strip conductor and the radio-frequency shield and insulates both from one another.

In an embodiment of the magnetic resonance apparatus, only one insulation cladding of the strip conductor lies between a line of the strip conductor and the radio-frequency shield.

In another embodiment, the strip conductor and the radio-frequency shield form a type of capacitor for radio-frequency grounding of the electrical line. Due to the small separation and the comparably large surface between the strip conductor and the radio-frequency shield, the capacitive coupling at the magnetic resonance operating frequency is so large that it constitutes an RF grounding of the feed.

In another embodiment, the radio-frequency shield is essentially fashioned as a hollow cylinder and the strip conductor is applied to the inner wall of the hollow cylinder parallel to the cylinder axis.

In a further embodiment, the electrical line has a distribution ring, essentially following the form of the radio-frequency shield, that is connected with azimuthally distributed sub-circuits of the detuning circuits. An advantage of such a distribution ring attached to the radio-frequency shield is that a field radiation region of the radio-frequency antenna is not disturbed by a distribution ring attached in this region.

In another embodiment, a second electrical line is mounted on the radio-frequency shield in the form of a strip conductor parallel to the first strip conductor and which has current flowing through it in the reverse direction. This type of current supply leads to a field compensation of the flowing direct currents, such that no influencing of the magnetic field ensues. Both lines can be placed next to one another or on one another, so a better compensation of the magnetic fields generated by the currents ensues.

The supply of a number of (sub) detuning circuits of a birdcage resonator leads to an optimal detuning effect since a number of rods, disconnected by at least one electrical line, are activated.

DESCRIPTION OF THE PREFERRED EMBODIMENTS

Figure 1:
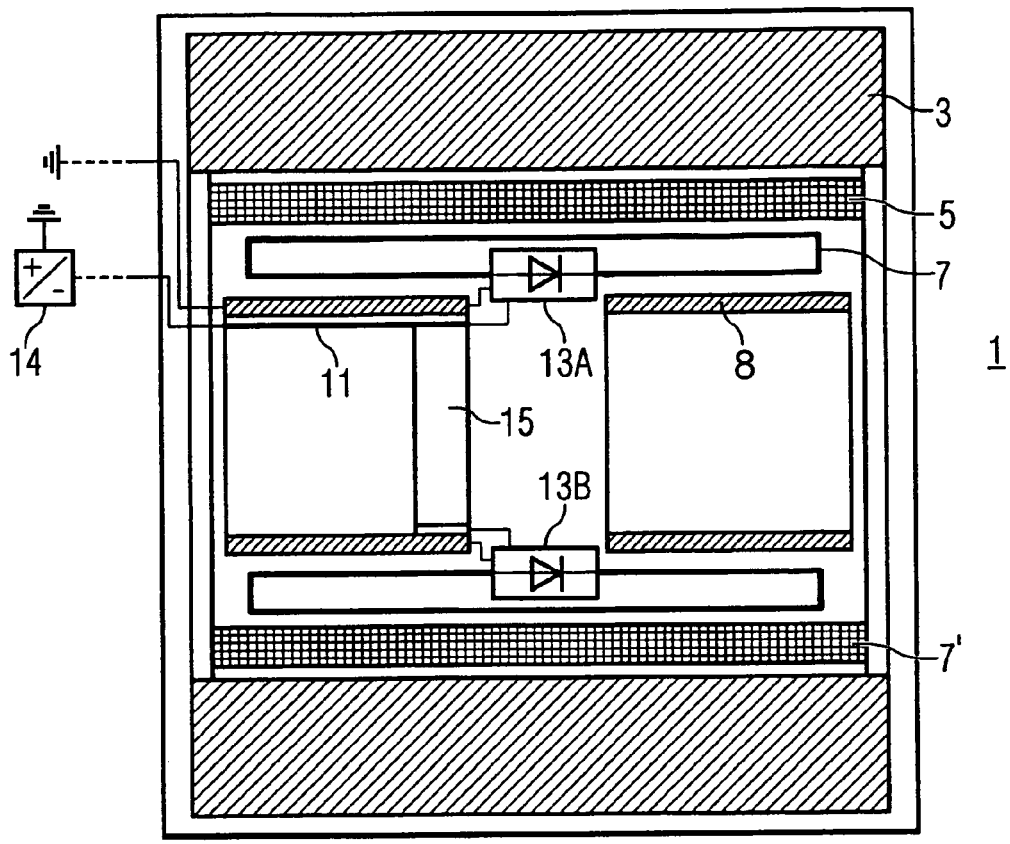
FIG. 1 is a schematic longitudinal section through a magnetic resonance apparatus with a strip conductor as an electrical line.

FIG. 1 shows a section through a magnetic resonance apparatus 1 with a basic field magnet 3, a gradient coil 5, an antenna conductor 7 of a radio-frequency resonator and a radio-frequency shield 9. A strip conductor 11 that serves as an electrical supply line to one or more detuning circuits 13A, 13B integrated into the antenna conductor 7 is glued onto the radio-frequency shield 9.

The detuning circuits 13A, 13B has one or more PIN diodes that are fed with a direct current during, for example, the transmission and are thereby switched low-ohmically. Upon receipt or upon transmission with local coils, the diodes are operated in a non-conducting (high-resistance) direction, i.e. a blocking voltage is applied that switches the PIN diodes to high-ohmic. A PIN diode is schematically included in the detuning circuit 13.

The detuning circuit 13 operating with PIN diodes thus requires a direct current/direct voltage feed that inventively ensues via the flat strip conductor 11 which is, for example, glued directly onto the radio-frequency shield 9.

The strip conductor 11 runs in the axial direction of the cylindrically-fashioned RF shield 9. The strip conductor 11 is connected with a direct current-direct voltage source 14. The strip conductor 11 is, for example, electrically insulated from the grounded radio-frequency shield 9 via an insulation cladding. Due to the small separation between a line of the strip conductor 11 and the radio-frequency shield 9 and due to the comparably large area between strip conductor 11 and radio-frequency shield 9, a large capacitive coupling exists at the magnetic resonance operating frequency. This corresponds to a radio-frequency grounding of the strip conductor 11. The strip conductor 11 lies very close to the radio-frequency shield 9, such that only very few magnetic field lines can penetrate between the radio-frequency shield 9 and the strip conductor 11. Correspondingly, barely any interferences can be induced in the strip conductor 11.

The distribution of the current to the detuning circuits 13A, 13B of the individual antenna conductors 7,7' ensues via a distribution line 15 that preferably is likewise formed from a flat strip conductor and is glued onto the radio-frequency shield. This arrangement has the advantage that no further measures are necessary in order to suppress the coupling of radio-frequency interferences on the direct current supply of the detuning circuit 13.

The embodiment in FIG. 1 shows a further feature, that the radio-frequency shield 9 is grounded and likewise is connected with the detuning circuits 13A, 13B. The direct current supply of the detuning circuits 13A, 13B is comprised of the strip conductor 11 (which is connected with the direct current/direct voltage source 14) and the earthed radio-frequency shield.

Figure 2:
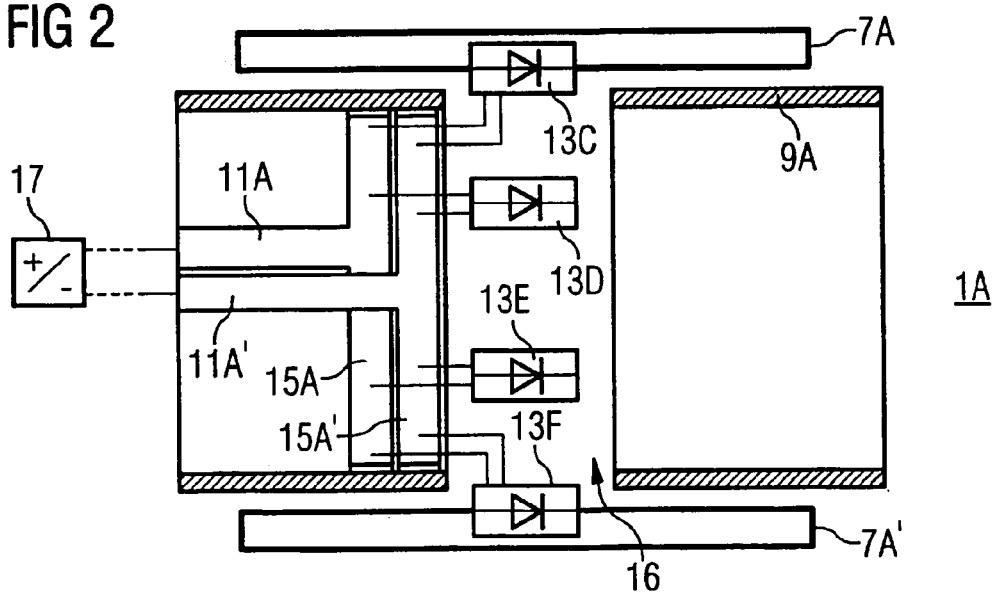
FIG. 2 is a schematic longitudinal section through a magnetic resonance apparatus with two strip conductors.

FIG. 2 shows a second similar embodiment of a magnetic resonance apparatus 1A, in which a direct current/direct voltage source 17 is electrically connected via two strip conductors 11A and 11A' with a number of azimuthally distributed detuning circuits 13C, . . . 13F. Each axially running strip conductor 11A, 11A' proceeds as a distribution ring 15A or 15A', such that the detuning circuits 13C, . . . 13F can be supplied with the same direct voltage or, respectively, the same direct current. This type of feed compensates the fields of the direct currents through the strip conductors 11A, 11A' and distribution rings 15A, 15A', such that no influencing of the static magnetic field occurs.

Additionally the structure and the distribution of the direct current feed to the (partial) detuning circuits 13C, . . . 13F is shown in FIG. 2. Both strip conductors 11A, 11A' run axially in the cylindrically-designed magnetic resonance apparatus along the radio-frequency shield 9A, which is bipartite. A central annular gap 16 allows a passage of magnetic field lines that are generated by the antenna conductors 7A, 7A'. The arrangement of the strip conductors 11A, 11A' and the distribution rings 15A, 15A' on the radio-frequency shield 9A result in no limitation of the gap 16 in the radio-frequency shield 9A and thus there is no significant impairment of the magnetic field.

The strip conductors used are, for example, one centimeter wide and a half-millimeter thick. The length corresponds to approximately one-half that of the radio-frequency shield and lies, for example, in the range of a half-meter, The gap 16 lies in the range of 10 cm.

Figure 3:
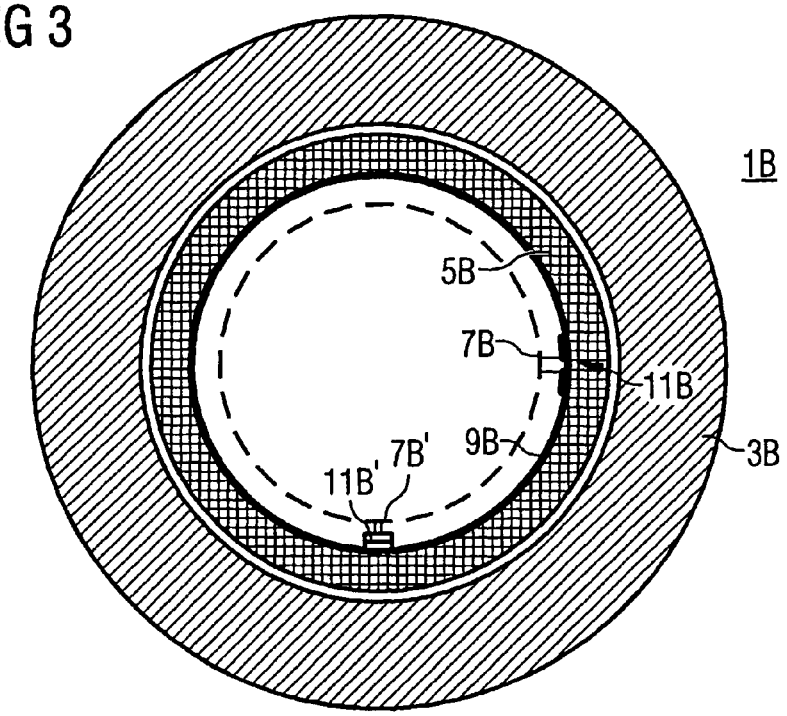
FIG. 3 is a cross-section through a magnetic resonance apparatus with an conventional antenna arrangement.

FIG. 3 illustrates a possible design of an MR apparatus with a conventional antenna arrangement and a direct current/direct voltage feed according to the invention. In this cross-section, a magnetic resonance apparatus 1B has radially from the outside inward, the base field magnet 3B of the gradient coil 5B, the radio-frequency shield 9B and a number of antenna conductors 7B, 7B', . . . The connection for two direct current feeds to the antenna conductors 7B, 7B' is schematically drawn. In the case of the antenna conductor 7B, two strip conductors 11B of the direct current feed lie next to one another on the radio-frequency shield 9B, and in the case of the antenna conductor 7B' two strip conductors 11B' of the direct current feed lie atop one another. Both possibilities lead to a good field compensation of the direct currents. The arrangements preferably are used consistently within a magnetic resonance apparatus.

Figure 4:
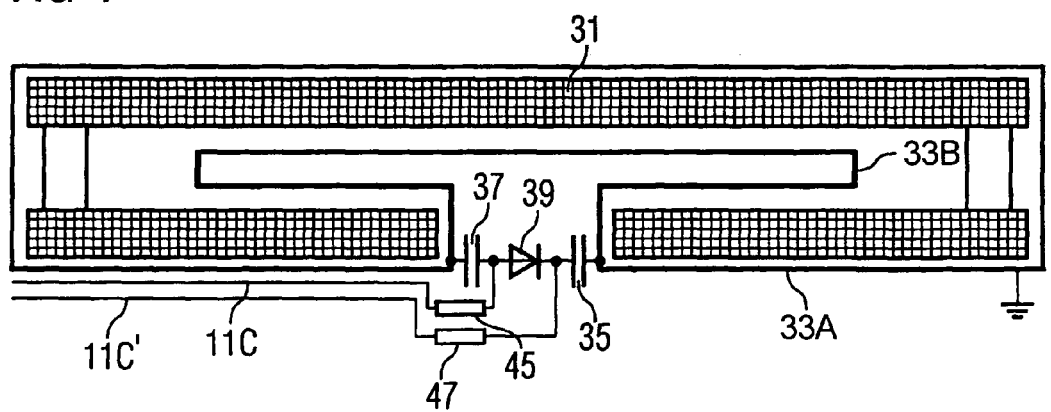
FIG. 4 is a longitudinal section through a magnetic resonance apparatus with a radio-frequency antenna integrated into a gradient coil.

FIG. 4 shows an inventive direct current feed in the example of a gradient coil 31 in which is integrated a radio-frequency shield 33A. Integrated in the radio-frequency antenna 33B is a detuning circuit (schematically shown) composed of capacitors 35, 37 and a PIN diode 39 connected between them. The diode 39 is activated by two strip conductor DC feeds 11C, 11C'. A characteristic of the arrangement In FIG. 4 is that the radio-frequency shield 33A and the radio-frequency shield 33A are electrically conductive, virtually forming one electrical component. In order to detune the resonance structure of the antenna 33B, a blocking voltage, for example −30 V, is applied to the diode 39. In the transmission or reception mode, the diode is supplied with a current, for example 300 mA. Two choke coils 45, 47 serve for the radio-frequency decoupling of the direct current path. Together with the capacitors 35, 36, they effect a separation of the direct current path from the radio-frequency path, and their ohmic resistance effects a corresponding current separation in the case of a number of detuning circuits.

For the detuning of a birdcage-like antenna for a circularly polarized RF field, at least two detuning circuits that are preferably azimuthally arranged at 90° to one another are necessary for two antenna conductors. All antenna conductors are preferably detuned. The common activation ensues, for example, with the aid of one or more distribution rings corresponding to FIG. 1 or 2.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising;
   a radio-frequency resonator;
   a radio-frequency shield at a reference potential;
   a voltage source providing a voltage with respect to said reference potential;
   a strip conductor connected to said voltage source and attached to said radio-frequency shield; and
   a detuning circuit connected to said radio-frequency resonator for selectively detuning said radio-frequency resonator, said detuning circuit being electrically connected to said radio-frequency shield and to said strip conductor.

2. A magnetic resonance apparatus as claimed in claim 1 wherein said strip conductor has a single insulator cladding disposed between said strip conductor and said radiofrequency shield.

3. A magnetic resonance apparatus as claimed in claim 1 wherein said strip conductor and said radio-frequency shield form a capacitor for radio-frequency grounding of said strip conductor.

4. A magnetic resonance apparatus as claimed in claim 1 wherein said radio-frequency shield comprises a hollow cylinder having an inner wall and a cylinder axis, and wherein said strip conductor is attached to said inner wall parallel to said cylinder axis.

5. A magnetic resonance apparatus as claimed in claim 1 wherein said radio-frequency shield comprises two shield parts separated from each other by an intervening gap, and wherein said detuning circuit is disposed in said intervening gap, and wherein said strip conductor is attached to said radio-frequency shield proceeding from an outer edge of one of said shield parts up to said intervening gap.

6. A magnetic resonance apparatus as claimed in claim 1 wherein said strip conductor forms a distribution ring conforming to a shape of said radio-frequency shield, and wherein said detuning circuit comprises a plurality of azimuthally distributed sub-detuning circuits, each electrically connected to said distribution ring.

7. A magnetic resonance apparatus as claimed in claim 1 wherein said strip conductor is a first strip conductor, and comprising a second strip conductor attached to said radio-frequency shield, parallel to said first strip conductor, and having current flowing therein in a direction opposite to a direction of current flowing in said first strip conductor.

8. A magnetic resonance apparatus as claimed in claim 7 wherein said first and second step conductors are disposed next to each other at said radio-frequency shield.

* * * * *